United States Patent [19]

Kalter et al.

[11] Patent Number: 4,506,341
[45] Date of Patent: Mar. 19, 1985

[54] INTERLACED PROGRAMMABLE LOGIC ARRAY HAVING SHARED ELEMENTS

[75] Inventors: Howard L. Kalter, Colchester; Francis W. Wiedman, Stowe, both of Vt.

[73] Assignee: International Business Machines Corporation, Armonk, N.Y.

[21] Appl. No.: 387,132

[22] Filed: Jun. 10, 1982

[51] Int. Cl.³ .............................................. G06F 7/50
[52] U.S. Cl. ................................... 364/786; 364/716; 307/465
[58] Field of Search .................. 364/786, 716; 307/465

[56] References Cited

U.S. PATENT DOCUMENTS

| 3,566,153 | 2/1971 | Spencer, Jr. et al. | 307/205 |
| 3,593,317 | 7/1971 | Fleisher | 340/172.5 |
| 3,702,985 | 11/1972 | Proebsting | 340/166 R |
| 3,761,902 | 9/1973 | Weinberger | 340/273 FF |
| 3,890,603 | 6/1975 | Jones et al. | 340/173 AM |
| 3,924,243 | 12/1975 | Vermeulen | 340/172.5 |
| 3,936,812 | 2/1976 | Cox et al. | 340/173 R |
| 3,974,366 | 8/1976 | Hebenstreit | 235/152 |
| 3,975,623 | 8/1976 | Weinberger | 235/152 |
| 3,987,287 | 10/1976 | Cox et al. | 235/152 |
| 4,032,894 | 6/1977 | Williams | 340/166 R |
| 4,037,089 | 7/1977 | Horninger | 364/716 |
| 4,124,899 | 11/1978 | Birkner et al. | 364/716 |
| 4,140,967 | 2/1979 | Balasubramanian et al. | 324/73 R |
| 4,237,542 | 12/1980 | Cukier | 364/716 |

OTHER PUBLICATIONS

Greenspan, "Multiple Partitioned Programmable Logic Array", IBM TDB, vol. 19, No. 5, Oct. 1976, pp. 1780-1781.
Robbins, "Array Logic Short Path", IBM TDB, vol. 19, No. 7, Dec. 1976, pp. 2544-2546.
Weinberger, "High-Speed Programmable Logic Array Adders", IBM J. Res. Develop., vol. 23, No. 2, Mar. 1979, pp. 163-178.
Schmookler, "Design of Large ALUs Using Multiple PLA Macros", IBM J. Res. Develop., vol. 24, No. 1, Jan. 1980, pp. 2-14.

Primary Examiner—David H. Malzahn
Attorney, Agent, or Firm—Howard J. Walter, Jr.

[57] ABSTRACT

A programmable PLA circuit in which an interlaced AND/OR array is provided which has both common input and common output lines. Separate AND and OR functions are generated during two different timing intervals such that both of the logical arrays can physically share input and output circuit elements. A binary adder is described in which pairs of array output lines are applied to the same Exclusive-NOR circuits during the two time intervals to provide the Exclusive-NOR of product terms during the AND array time interval and to provide the Exclusive-NOR of sum of product terms or the sum of the Exclusive-NOR of product terms during the second time interval.

10 Claims, 15 Drawing Figures

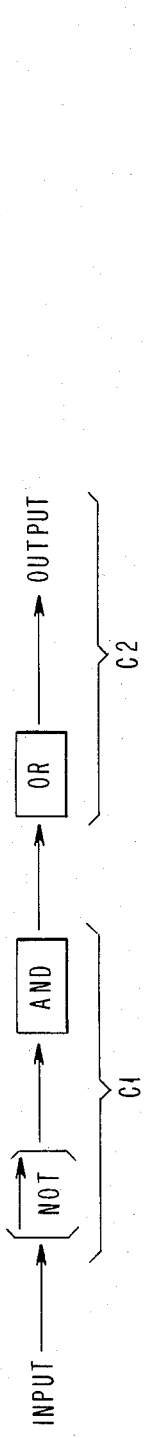
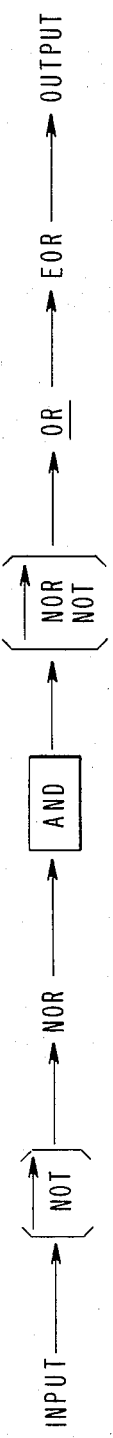
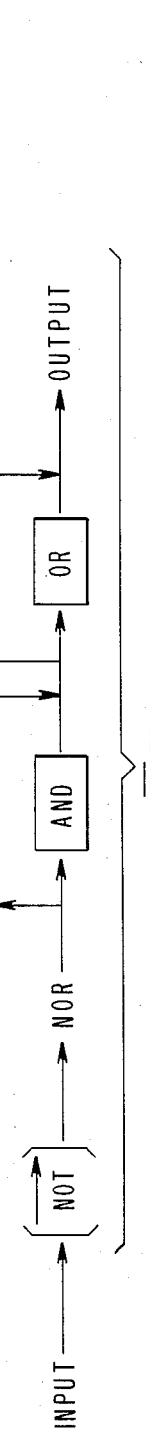
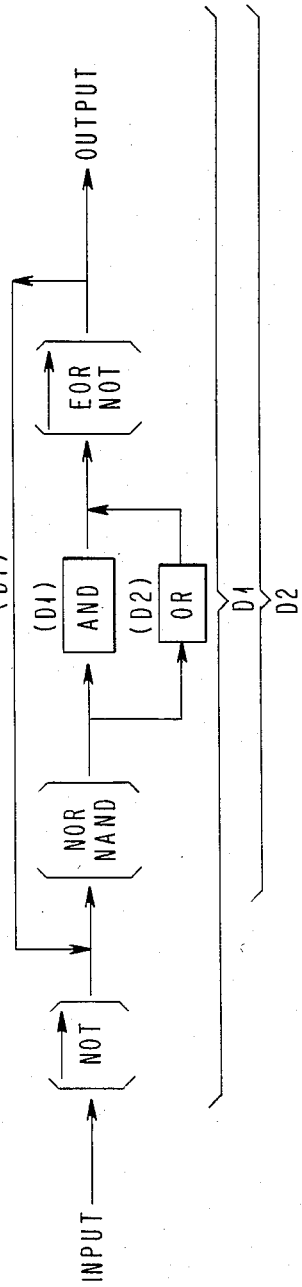
FIG. 1B (PRIOR ART)
FIG. 2B (PRIOR ART)
FIG. 3B (PRIOR ART)
FIG. 4B

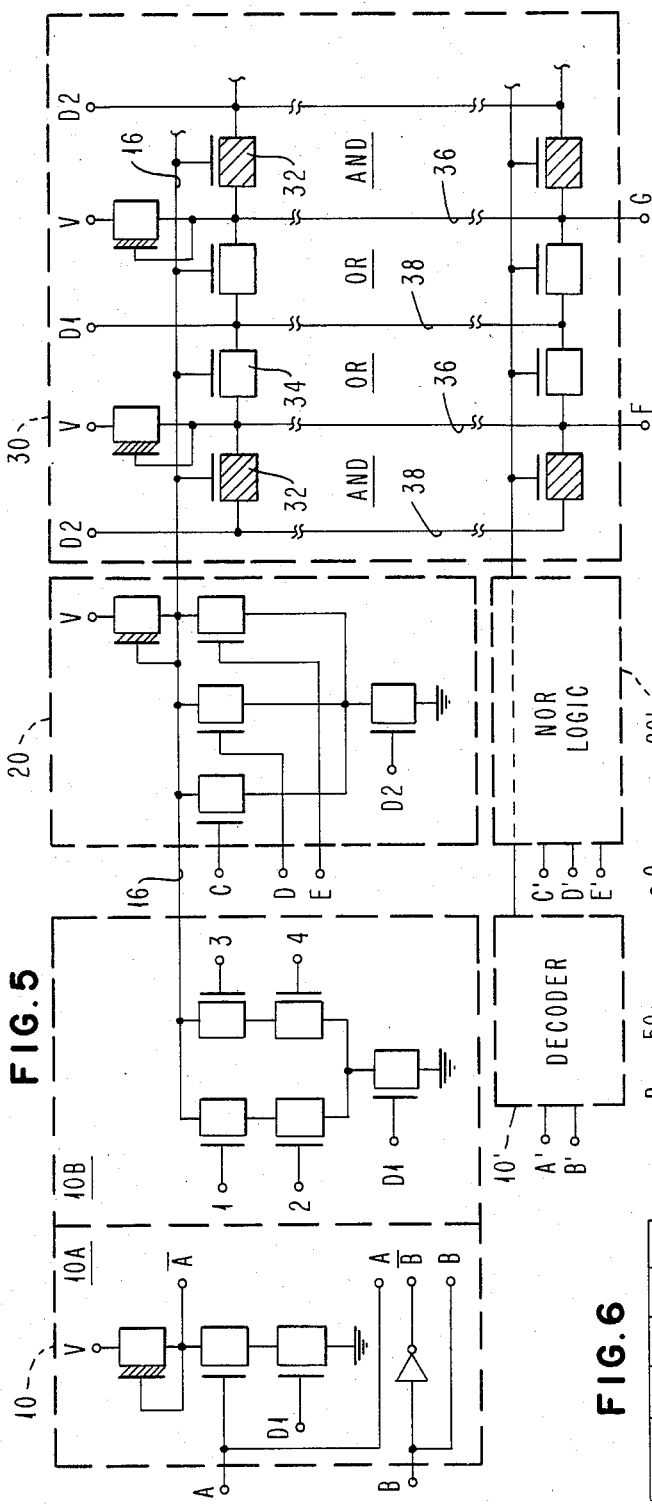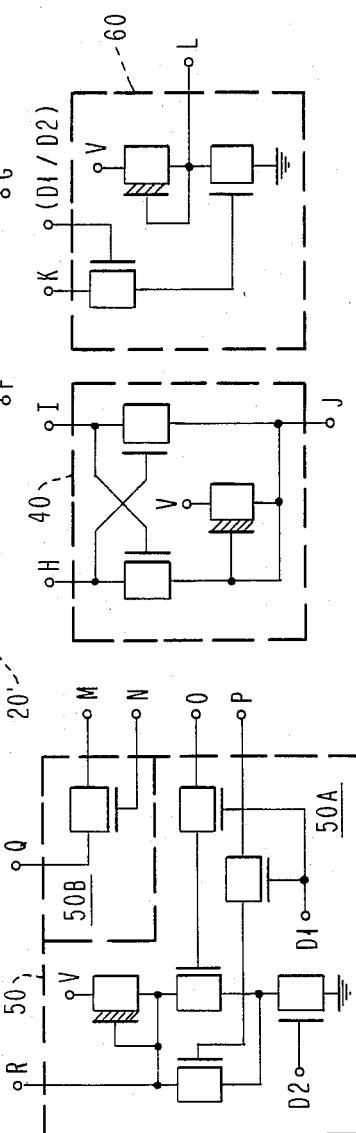
FIG. 5
FIG. 6

FIG.7A
$$S3 = H3 \not\vee CIN \quad S1 = \overline{(H1 \not\vee P2) \not\vee \overline{(\overline{H2} + C3)}}$$
$$S2 = \overline{H2 \not\vee \overline{C3}} \quad S0 = \overline{H0} \not\vee \overline{(G_1^2 + H_1^2 C3)}$$
$$COUT = \overline{P0} \not\vee \overline{(\overline{H0} + G_1^2 + H_1^2 C3)}$$
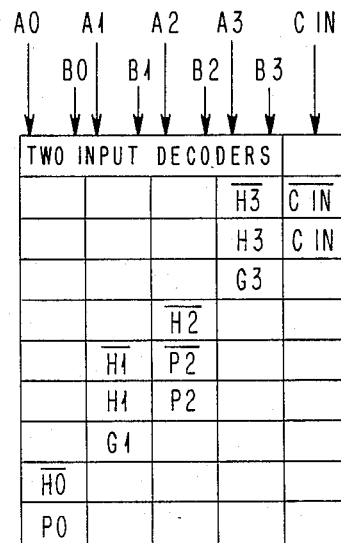
FIG.7B
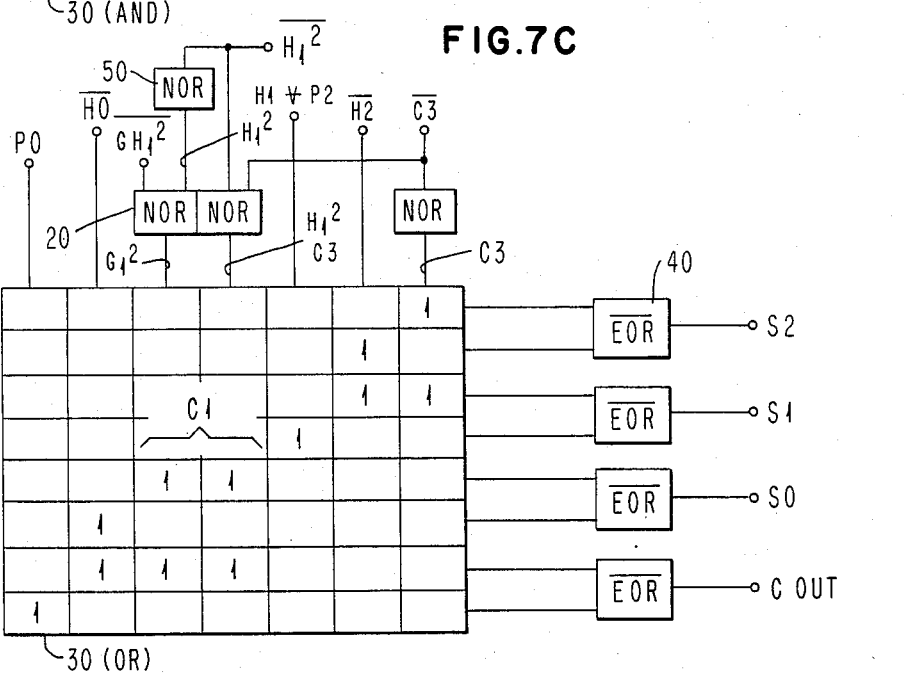
FIG.7C

INTERLACED PROGRAMMABLE LOGIC ARRAY HAVING SHARED ELEMENTS

BACKGROUND OF THE INVENTION

1. Field of the Invention

This invention relates to digital logic circuits and particularly to programmable logic array semiconductor devices which are capable of performing complex logic functions with a minimum of circuitry.

2. Description of the Prior Art

Programmable Logic Array (PLA) circuitry typically includes a search, or AND, array coupled to a read, or OR, array each including a plurality of programmable semiconductor devices. The arrays are operated to sequentially implement AND or OR logic functions. A basic PLA organization is taught in U.S. Pat. No. 3,702,985 to Proebsting and in U.S. Pat. No. 3,566,153 to Spencer, a modified version of which is illustrated in FIG. 1A, herein. In operation, a plurality of input signals are applied to a series of single input decoders which apply true and complement signals to the AND array, typically implemented with NOR circuits since a NOR circuit performs a logical AND function of complemented input signals. The outputs of the AND array are designated as product terms PT and are applied directly to the inputs of an OR array, also typically implemented with NOR circuits, in order to perform a negative OR logical function of selected product terms. The output signals of the OR array are designated as sum of product terms, or sum terms ST, and are typically stored in output latches to be applied to circuits external to the PLA or can be reapplied to the input decoders for further sequential logic operations. U.S. Pat. No. 3,974,366 to Hebenstreit is of interest as it teaches the use of independent clock inputs, shown in FIG. 1A as C1 and C2, to sequentially control the implementation of the AND and OR functions. The sequential logical operations, excluding external feedback, performed in the basic PLA of FIG. 1A are shown in FIG. 1B. Input signals or their complements are applied to the AND array during C1 time. During C2 time the logical OR array and output circuitry are enabled.

Although a number of useful logic functions can efficiently be implemented using simple PLA organization, complex functions such as binary n-bit counters require excessive array area because of the large number of product terms required. Reduction in the number of product terms necessary to implement a particular logic function can be achieved to some extent by partitioning the input signals into groups of input bits prior to generating the product terms, as taught in U.S. Pat. No. 3,593,317 to Fleisher et al, or by partitioning the input signals into pairs of input bits, as taught in U.S. Pat. No. 3,761,902 to Weinberger. The later technique is known as two-bit partitioning and is extensively used in PLA design as all 16 Boolean logic functions of the input bit can be expressed using only four input lines of the AND array. A significant reduction in the number of product terms can be realized using two-bit partitioning alone. Other area and product term reduction techniques are also known. For example, Exclusive-OR circuits implemented at the outputs of the OR array, as taught in U.S. Pat. No. 3,890,603 to Jones et al may be used to further reduce the number of logic functions executed within the AND and OR arrays of a PLA.

Further PLA reduction techniques include providing logic functions which operate on the product terms before they are provided to the OR array. For example, U.S. Pat. No. 4,032,894 to Williams, teaches the use of selected product term inverters located between the AND and OR arrays. The use of two-bit partitioning of product terms is taught in the article "Multiple Partitioned Programmable Logic Array", by S. B. Greenspan, IBM Technical Disclosure Bulletin, Vol. 19, No. 5, October 1976, pp. 1780–1781. This technique enables an increase in the number of product terms which are available to be applied to the OR array. FIG. 2A represents a block diagram of a basic AND/OR PLA as modified by these techniques and FIG. 2B repesents the sequence of logic operations, including optional operations, which may be executed by such modified PLAs.

Another PLA variation is taught in the article "Array Logic Short Path", by G. J. Robbins, IBM Technical Disclosure Bulletin, Vol. 19, No. 7, December 1976, pp. 2544–2546. Here a capability is provided to provide product terms directly to the PLA output, either bypassing or operating in parallel with the OR array, in order to increase the speed at which some of the array output signals are available.

Yet another PLA variation is taught in U.S. Pat. No. 4,140,967 to Balasubramanian et al, which teaches a merged AND/OR array where alternating columns of a single matrix form both AND and OR sub-arrays, either one of which is capable of being independently driven as a single array under special test conditions. FIG. 3A represents such an array which includes previously described two-bit partitioning of input signals coupled to a matrix including two sets of orthogonal lines. Under normal PLA operating conditions the input decoders drive a first set of horizontal lines which, in combination with the AND sub-array, generate product terms PT1-PT3 on a first set of vertical lines, as in the AND array of a two-array PLA. The vertical product term lines are selectively interconnected directly to overlying ones of a second set of horizontal lines (indicated by an X) which, in combination with the OR sub-array, generate sum terms ST1-ST3 on a second set of vertical lines. The sum terms are then coupled to output logic as in other PLAs. The merged PLA thus operates in the normal AND/OR sequence of directly coupled PLAs as in FIG. 1A. A feature of this merged array is a provision for driving either the AND or the OR sub-array directly by the input decoder, or bit partitioning, circuits so that each of the AND and OR sub-arrays may, be independently tested. A plurality of single-pole single-throw switches SW1 and SW2, responsive to input signals T1 and T2, control the application of the input signals to either the AND sub-array or the OR sub-array. Similar switches are used to couple the output signals to the output logic. FIG. 3B illustrates the sequential logic performed by the merged array under normal and test conditions.

Various other modifications are known to be useful to reduce the area of PLAs such as splitting or folding of input or output lines as taught in U.S. Pat. No. 3,987,287 to Cox et al. Techniques known for increasing the number and/or complexity of logic terms include cross-field partitioning of OR array outputs with input signals as taught in U.S. Pat. No. 3,924,243 to Vermeulen, the use of a plurality of sub-arrays as taught in U.S. Pat. No. 3,975,623 to Weinberger, and the extensive use of double-level interconnection metallurgy to allow more flexible personalization of input/output and feedback lines as taught in U.S. Pat. No. 3,936,812 to Cox et al.

In view of the above improvements, considerable reduction in array area and simplification of array-performed logic is possible making PLA logic implementation competitive in many areas to custom designed logic. In prior art techniques in which the array-performed logic has been decreased; it has been accomplished by increasing the number and complexity of non-array logic performing circuits, sometimes to the point of increasing the total circuit area of the PLA plus supporting circuitry. In addition, highly complex logic implementations such as binary adders require a large number of array-generated logic terms and accordingly are impractical to implement in PLA logic.

The development of multi-functional semiconductor devices such as microprocessor chips requires more logic function be placed on a single semiconductor substrate. Microprocessor systems designers are attempting to meet user requests for 16 and 32 bit processing units. A 32 bit binary adder implemented in a conventional AND/OR PLA using two-bit input partitioning and Exclusive-OR output circuits as described by A. Weinberger in the article "High-Speed Programmable Logic Address", IBM J. Res. Develop., Vol. 23, No. 2, March 1979, pp. 163–178, requires a total of 195 product terms and 196 array columns for a total of 38,220 array bits. Such a PLA requires a considerable area which is impractical to implement on the same semiconductor chip as other required microprocessor logic and memory circuits.

SUMMARY OF THE INVENTION

In accordance with this invention binary adders and other highly complex logic functions are implemented in a PLA format which not only enables a reduction in the number of array logic bits required but, by sharing physical and logic performing elements, enables significant reduction in the required area and number of non-array logic performing circuits.

The PLA of the invention maximizes the physical sharing of array-related elements by using only a single set of input lines shared by both the AND and OR portions of an interlaced AND/OR array. Both product terms and sum terms are also generated on a single set of output lines. Array input and output signals are time-division multiplexed such that in many instances both input and output circuitry for the AND and OR functions can be physically shared. The availability of Exclusive-OR operators, implemented as Exclusive-NOR circuits, on the common outputs of the AND and OR sub-arrays further enhances the ability of the PLA to perform complex logic functions and is particularly useful in binary adder design as will be demonstrated.

These and other features of the invention will be more clearly apparent in the accompanying description of the preferred embodiment, as illustrated in the following drawings.

DESCRIPTION OF THE DRAWINGS

FIG. 4B illustrates the sequence in which logic functions are executed in the PLA of the invention under control of the timing pulses D1 and D2.

FIG. 5 is a cross-sectional circuit schematic diagram illustrating one technique of implementing the PLA of FIG. 4A in n-channel MOSFET devices.

FIG. 6 is a tabular representation illustrating the various input connections necessary to provide appropriate binary adder-related logic functions for using the PLA of FIG. 5 as a binary adder.

FIG. 7A are the logical equations used to define the output bits of a 4-bit binary adder.

FIG. 7B is a schematic representation of the logic implemented in the AND sub-array of the invention to provide the 4-bit binary adder of FIG. 7A.

FIG. 7C is a schematic representation of the logic implemented in the OR sub-array of the invention to provide the 4-bit binary adder of FIG. 7A.

DESCRIPTION OF THE PREFERRED EMBODIMENT

Figure 1A:
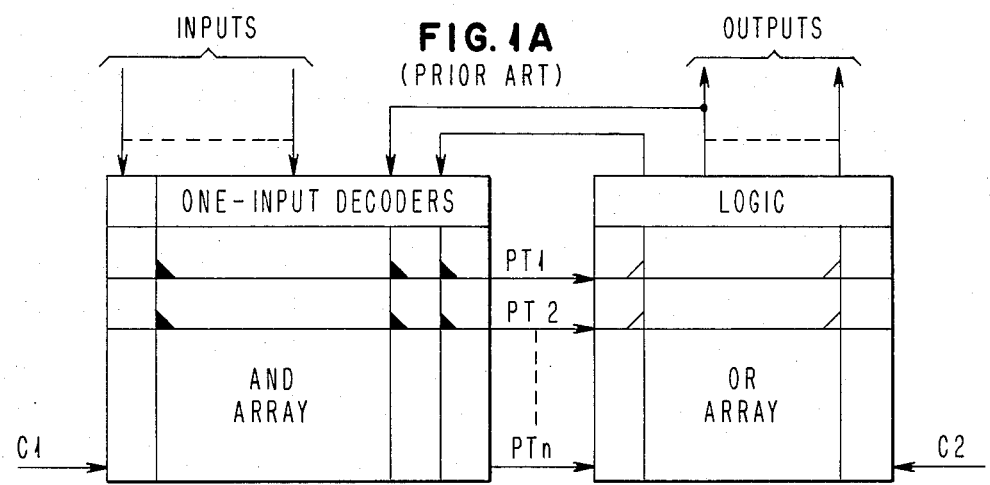
FIGS. 1A and B illustrate the organization and sequential logic functions of a prior art PLA including an AND array directly coupled to an OR array.
Figure 2A:
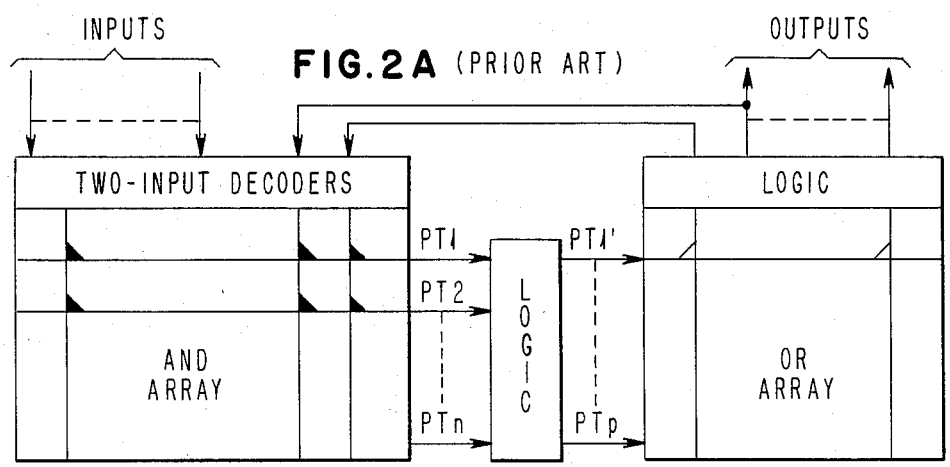
FIGS. 2A and B illustrate the organization and sequential logic functions of another prior art PLA in which intervening logic functions are implemented between the AND and OR arrays.
Figure 3A:
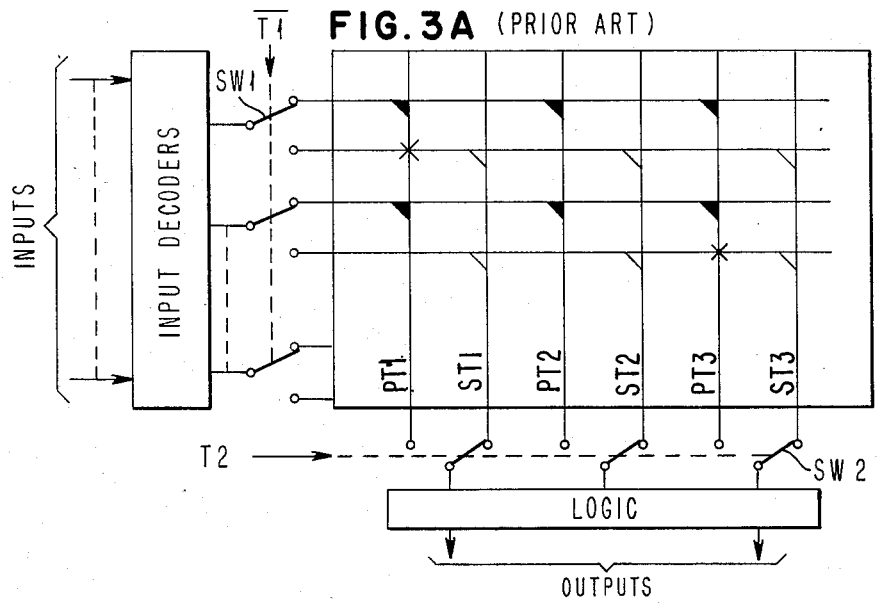
FIGS. 3A and B illustrate the organization and sequential logic functions performed by a third prior art PLA using a single merged array containing both AND and OR sub-arrays and including testing provisions for independently evaluating either the AND or the OR array.
Figure 4A:
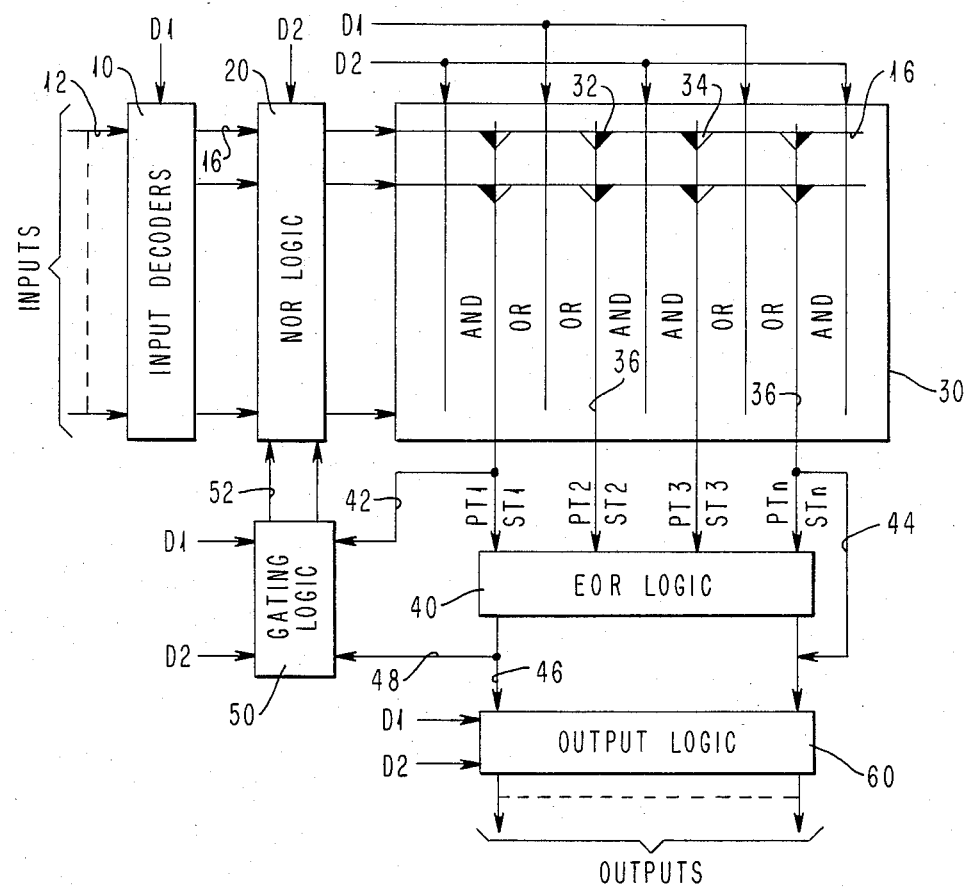
FIG. 4A is a block diagram of the PLA of the invention which illustrates the physical sharing of input and output lines within the array as well as the sharing of both input and output circuitry.

Referring to FIG. 4A there is shown a block diagram of the PLA of the invention. The primary elements of which are the input drivers including input decoders 10 and NOR logic 20, logic matrix or array 30, Exclusive OR logic 40, coupling or gating logic circuits 50 and output logic or latch circuits 60. The active states of each circuit element is determined by the presence or absence of the timing signals D1 and D2, which implement the AND and OR functions.

The input decoders 10 receive a plurality of input signals 12 and perform during the presence of timing signal D1 a decoding function, including inverting and bit partitioning, if desired, to provide a first set of output signals on lines 16 which represent the input or drive signals for the AND array logic function. Drive lines 16 pass through NOR logic block 20 and are directly coupled to the horizontal lines passing through array 30. Within array 30 are a number of potential AND gates 32, indicated as blackened triangles, and OR gates 34, indicated by open triangles, both types of which are responsive to input signals on lines 16. During the time when D1 is active and D2 is inactive, only the AND gates 32 are enabled. Product terms, composed of the logical AND of the signals present on selected ones of lines 16, are generated on the vertical array output lines 36 which pass out of array 30 as product terms PT1–PTn.

Depending upon the specific logic function to be implemented product terms may be applied to various of the remaining circuits as follows. First, and of primary significance, pairs of product terms may be applied to Exclusive-OR logic 40 to generate the function $(PTx) \veebar (PTy)$, where $\veebar$ represents the logical Exclusive-OR function. Product terms may also be applied to the input of gating logic circuits 50, via line 42, or directly to output logic 60, via line 44. Exclusive-ORed product terms may be applied either to output logic 60, via line 46, or to gating logic 50, via line 48. Thus during a first time interval, determined by timing pulse D1, generated product terms or the Exclusive-OR of product terms may be present in either output logic 60 or gating circuits 50. The sequential logic implemented during the time D1 is active is illustrated in that portion of FIG. 4B bracketed by D1.

Figure 4C:
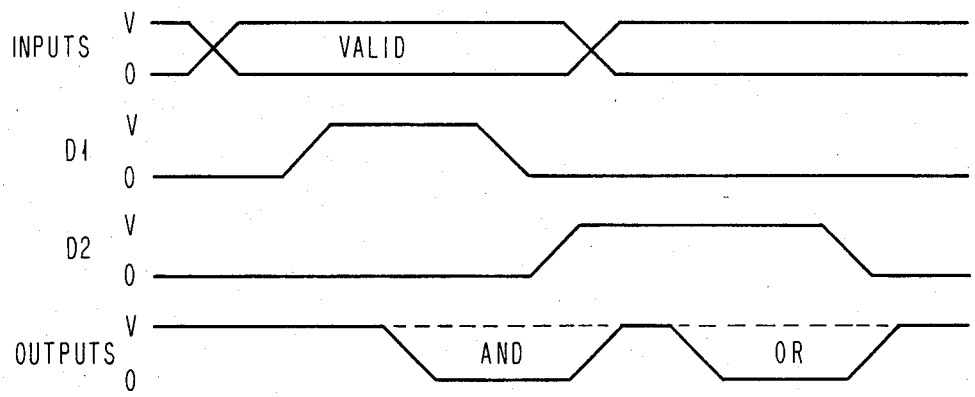
FIG. 4C is a timing diagram illustrating the relationship between the input, output and internal states of the PLA of FIG. 4A as controlled by timing pulses D1 and D2.

During a second time interval, determined by timing pulse D2, product term signals present in gating logic circuits 50 are applied to the inputs of NOR logic circuits 20, which are enabled only in the presence of timing pulse D2, to generate a second set of output signals on at least selected ones of lines 16. This second set of output signals corresponds to the input signals for the OR array logic function. During the time D2 is active only the OR gates 34 of array 30 are active, thus a plurality of sum of product terms or sum terms ST1–STn are generated on array output lines 36. The sequential logic implemented during the time D2 is active is illustrated in that portion of FIG. 4B bracketed by D2. As with the product terms PT1–PTn, the sum terms ST1–STn may be applied to Exclusive-OR logic 40 or directly to output logic circuits 60 to obtain any of the following output functions: PT, PT$\veebar$PT, PT+PT, (PT+PT)$\veebar$PT, (PT+PT)$\veebar$(PT+PT), (PT$\veebar$PT)+PT, (PT$\veebar$PT)$\veebar$(PT$\veebar$PT), (PT$\veebar$PT)+(PT$\veebar$PT), and (PT$\veebar$PT)$\veebar$(PT+PT), where each product term PT is a different logical AND function of the input signals generated on lines 16 during the AND array portion of the PLA cycle. The timing relationship between inputs, outputs and D2 are shown in FIG. 4C.

The physical sharing of various ones of the input, array and output circuit elements enables a considerable reduction in the semiconductor area required to implement the PLA of the invention. In addition, the ability to perform additional logic functions, particularly on the product terms enables a considerable reduction in the size of the array necessary to implement complex functions, as will be demonstrated below.

Referring to FIG. 5 there is shown a cross-section of typical circuit types which may be used to implement the PLA of FIG. 4A in n-channel MOSFET technology, although any semiconductor technology may be used. Like reference numbers are used to represent like elements in FIGS. 4A and 5.

Input decoders 10 include two functional portions. Portion 10A provides the true and complement of input signals and portion 10B provides the actual input signal decoding. In circuit 10A a simple clock-responsive inverter circuit is used to generate complemented input signals. Circuit 10B is a clock-responsive NAND/NOR circuit which is responsive to selected ones of the input signals and their complements to generate any desired partitioned logic function of inputs A and B selectively wired from the outputs of circuit 10A to the inputs 1, 2, 3 and/or 4 of circuit 10B. The number of circuits 10B required varies with any particular PLA organization but is equal to the larger of the number of AND array inputs or OR array inputs required to provide the logic function to be executed. If a generalized PLA, as opposed to a custom designed PLA, is to be designed, the number of decoder circuits can be predetermined and only those required need be interconnected. The decoded output signals of circuit 10 appear on line 16 which passes through both NOR logic circuits 20 and array 30.

NOR logic circuits 20 are simple clock-responsive NOR gates having a plurality of inputs, for example three C, D and E are illustrated. The NOR gates are only active when pulse D2 is high to provide the drive signal on line 16 representing the OR array input signals. The NOR circuit input terminals may be responsive to any of a number of signals as described below.

Array 30 comprises a plurality of MOSFET devices arranged in columns and rows, only a portion of which are shown. AND input-responsive devices 32 and OR input-responsive devices 34 are serially connected between alternating column output lines 36 and column select lines 38. Each column of devices has the potential to act as a NOR logic gate with respect to the signals placed on row lines 16. The presence or absence of a functional device 32 or 34 determines the specific output function provided on output lines 36. During the time period when pulse D1 is high only AND devices 32 are enabled since their source electrodes are coupled to clock pulse D2 which is at zero volts when D1 is high. OR devices 34 are prevented from conducting by placing the high level D1 signal on their source electrodes. In a similar manner OR devices 34 are enabled only during the time that D2 is high. Devices 32 and 34 may be selectively programmed to be functional by any number of known techniques for implementing read only memory arrays. Programming can be performed either during the manufacturing process or after it is complete. The former is preferred since the selective interconnection of inputs and outputs is performed during the later stages of manufacture of the PLA. Output lines 36 extend beyond the array area proper, as indicated by output terminals F and G. During the time period in which D1 is active the signals on terminals F and G represent product terms and during the time period in which D2 is active represent sum terms.

Array output terminals F and/or G can be selectively connected to any one or more of terminals H, I, K, M, N, O or P depending upon the signal present and the logical function desired, as described below.

Exclusive-OR logic 40 comprises a plurality of simple Exclusive-NOR circuits, the inputs H and I are coupled to the desired pair of array output terminals F and G. The function $\overline{H \veebar I}$ appearing at terminal J may be coupled to any of terminals K, M, N, O or P, as necessary.

If the product term signal present on one or more of the array output terminals or the Exclusive-NORed signal on terminal J represent a PLA output signal, it may be selectively coupled to terminal K of the output logic circuit 60 during the time D1 is active. Output circuit 60 may be a simple inverter as shown or may be any form of data storage latch as are well known in the art. If the circuit shown is used, the inverted output signal will be available at the time D1 is active. The use of a clock-responsive inverter, such as shown in input inverter 10A, will, if gated by the D2 pulse, present the product term output signal at D2 time along with the other outputs.

If the signal at any of the array output terminals or the Exclusive-NOR outputs is required for another logical function, it may be coupled to one or more of the input terminals M, N, O or P of gating logic circuit 50. Gating circuit 50 includes a sub-circuit 50A which can provide the function of an inverter or a NOR circuit, the output of which is available at terminal R during the time D2 is active. A second type of gating circuit 50B comprises a single device which may be selectively connected to gate a product term output of an Exclusive-NORed output connected to terminal M to output terminal Q by coupling clock pulse D1 to terminal N. Circuit 50B may also be used as an AND gate by using three different sub-circuits 50B, two of which generate isolated signals at their outputs, as gated by the D1 pulse, and a third circuit in which the input terminals M and N are responsive to the signals on the respective output terminals Q.

The signals generated at output terminals Q and R of circuit 50 are selectively coupled to the input terminals C, D and/or E of NOR logic circuits 20. During the time that D2 is active circuits 20 provide the input signals for the OR function of array 30 to generate the sum terms which appear on the array output 36 lines. In a manner similar to that for the product terms, the sum terms may be coupled to the output circuit 60 or may be coupled to the Exclusive-NOR circuits prior to being coupled to the output circuits.

While a particular embodiment has been described to illustrate the invention, those skilled in the art will recognize that certain modifications may be desired. For example, in order to prevent dissipation of DC power the common source lines 38 in array 30 may be controlled by a series device coupling line 38 to ground and having D1 or D2 applied to its gate electrode for the activation of the AND and OR functions respectively, as opposed to using the D2 and D1 clock signals directly as shown.

Figure 8:
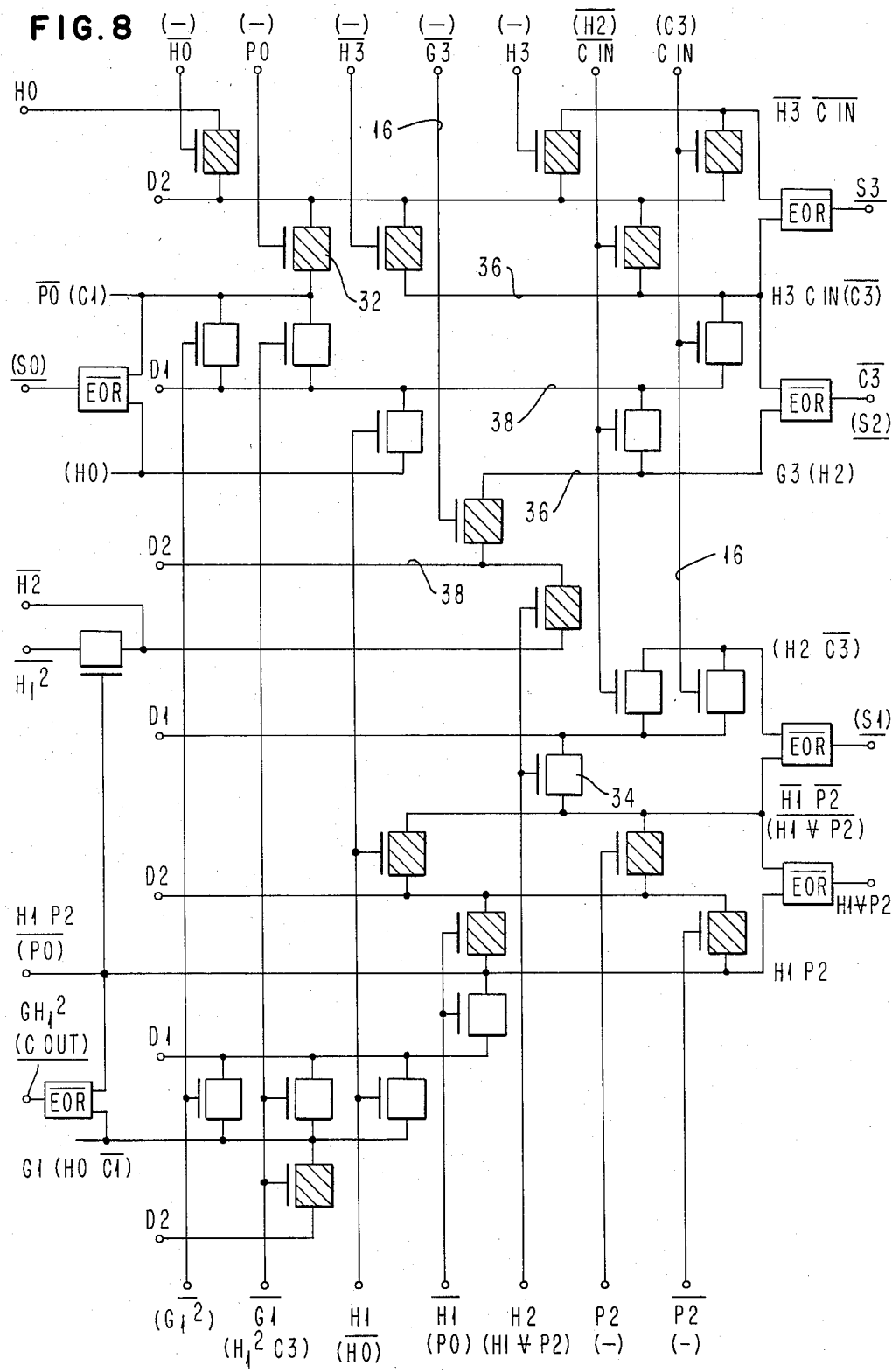
FIG. 8 is a circuit schematic diagram of a MOSFET-implemented array portion of the PLA in FIG. 7 and illustrates the sharing of input and output lines as well as the associated shared Exclusive-NOR logic circuits. Logical input and output signals for both AND and OR array functions are also designated.

FIGS. 6, 7 and 8 provide a representative example of the implementation of a particular logic function using the PLA of the invention.

In the past, the implementation of binary adders has received considerable attention with respect to implementation by PLA logic. As the requirements of integrated circuit-implemented data processing functions have advanced, the need for functional logic capable of executing arithmetic functions on 16 or even 32 bit-wide data groups has become increasingly more important. Previously, it has been impractical to implement adder functions in PLAs because of the extremely large number of product terms and total bit area required. The articles, "High-Speed Programmable Logic Array Adders" by A. Weinberger, IBM Journal of Research and Development, Vol. 23, No. 2, March 1969, pp. 163-178, and "Design of Large ALUs Using Multiple PLA Macros", M. S. Schmookler, Id., Vol. 24, No. 1, January 1980, pp. 2-14, describe the state of the art in PLA adder logical design in which extensive use is made of other than simple PLA AND/OR logic in order to provide multibit binary adders which require only a single pass through a PLA and its associated circuitry.

Although the same logical principles and design approach may be used for the design of an n-bit adder, an example is provided for a 4-bit binary adder in order to simplify the description of the application.

Using the nomenclature and design approach taught in the above Weinberger article and modifying the equations to more fully utilize the Exclusive-OR function, the equations for a 4-bit adder can be expressed as illustrated in FIG. 7A in which the sum bits S3, S2, S1 and S0 and the carry-out bit Cout are defined in terms of the well-known logical adder functions H, P and G available as outputs from two-bit partitioning of equal weighted input signals.

FIG. 7B illustrates the logical generation of the product terms in the AND-subarray portion of array 30. Note that the output bit S3 is generated directly by the Exclusive-NOR gates 40. FIG. 7C illustrates the logical generation of the remainder of the output bits S2, S1, S0 and Cout during the OR portion of the PLA cycle. Both sets of NOR gates 50 and 20 are used to generate the logical equivalent of the carry-out bit C1 which is used internally only. Note also that in the AND-array portion shown in FIG. 7A the maximum number of different input terms needed to generate products terms for any single input bit position is three. Thus, the number of required columns of the AND sub-array is also three, representing a 25 percent reduction in array area required, since a conventional two-bit partitioned input circuit would normally require all four different input terms available from the partitioning two binary numbers.

FIG. 8 is a circuit schematic of the implementation of the 4-bit adder of FIG. 7 using n-channel enhancement mode MOSFET devices. The input terms generated for the AND array portion of the PLA are shown immediately adjacent to the input lines 16, which have been split in accordance with prior art teachings to apply input signals to both the top and bottom of columns of the array. The inputs to the OR array portion of the PLA are shown in parentheses adjacent to the AND input terms. Unused inputs are illustrated by a dash and are biased off by appropriate application of clock signals D1 and D2 to the respective input circuits. Adjacent to each horizontal output line 36 is the appropriate product, sum term, or both, which are indicated using the same notation for the AND and OR output terms as used with the respective input terms. The sub-array output terms are indicated in a similar manner, with the PLA or adder output bits being underlined. The output lines 36 are also split in a manner similar to the input lines 16. Because the array input and output lines are shared in both the AND and OR portions of a PLA cycle the splitting of these lines must be identical for each of the sub-arrays. As was done previously, the AND array devices 32 are shown with shading lines in order to more clearly illustrate the functionally different AND devices 32 and the OR devices 34. The entire 4-bit counter has been implemented using a total of only 25 array devices requiring a matrix of 7×13 devices or a total of 91 bits.

In order to illustrate the dramatic reduction in required array space for PLAs implemented by this invention, a comparison of various types of array-implemented adders is shown in Table I for both 4 and 16-bit adders. The types of arrays illustrated include:

Type 1—a simple table look-up adder,
Type 2—a standard AND/OR array PLA using single-bit input decoders,
Type 3—AND/OR array PLA using two-bit input partitioning,
Type 4—AND/OR array PLA using two-bit input partitioning and Exclusive-OR outputs,
Type 5—subsets of AND/OR array PLAs as described in the cited article by M. S. Schmookler, Type 6—the PLA of the invention without use of array reduction techniques such as splitting of input and output lines, and Type 7—the PLA of the invention using splitting of input and output lines.

The terms compared for each array type are the number of product terms Np, the number of columns Nc and the total bit space required Nb.

TABLE I

| ARRAY | | NUMBER OF ADDER BITS | |
|---|---|---|---|
| | | 4 bits | 16 bits |
| Type 1 | Np | 512 | $8.5 \times 10^9$ |
| | Nc | 15 | 50 |
| | Nb | 7680 | $4.2 \times 10^{11}$ |
| Type 2 | Np | 105 | $5.2 \times 10^5$ |
| | Nc | 23 | 83 |
| | Nb | 2415 | $4.3 \times 10^7$ |
| Type 3 | Np | 21 | 273 |
| | Nc | 23 | 83 |
| | Nb | 483 | 22,659 |
| Type 4 | Np | 10 | 68 |
| | Nc | 28 | 100 |
| | Nb | 280 | 6,800 |
| Type 5 | Np | 7 | 73 |
| | Nc | 27 | 93 |
| | Nb | 189 | 6,789 |
| Type 6 | Np | (9 + 8) | (36 + 16) |
| | Nc | 14 | 52 |
| | Nb | 238 | 2,704 |
| Type 7 | Np | (9 + 4) | (18 + 16) |
| | Nc | 7 | 33 |
| | Nb | 91 | 1122 |

Note that the number of product terms Np for PLAs of the invention, types 6 and 7, includes the number of product and sum terms, the first number representing the product terms and the second the sum terms, since both product and sum terms are applied along the row dimension of the array matrix. Since the term Nb represents the total Read-Only Memory or array area needed to implement any of these adders, the significant decrease in Nb between the adders of the invention and those of Types 1 through 5, particularly for the 16-bit adder, is of considerable importance to circuit designers attempting to design 16 and 32 bit microprocessors on a single semiconductor chip.

In addition, the PLA of the invention is capable of further reduction, for example by the use of 4-bit partitioning input decoders as described in the above Weinberger article.

While the PLA of the invention enables significant reduction in array bit-area, the sharing of physical elements in both the array itself and in the required support circuits provides an even greater reduction in the total required PLA area.

While the invention has been described in terms of a particular embodiment, those skilled in the art will recognize that certain other PLA techniques may also be used in conjunction with the invention.

What is claimed is:

1. In a programmable logic array circuit including a first logic array responsive to first input signals for providing first output signals corresponding to the logical product terms of selected input signals during a first time interval and second logic array responsive to second input signals to provide during a second time interval output signals corresponding to sums of selected product terms provided by the first logic array, each logic array including a plurality of input lines and a plurality of output lines, the improvement characterized in that at least some of the input lines of both of the first and second logic arrays are physically common and at least some of the output lines of both the first and second logic arrays are physically common, said programmable logic array circuit including first logic means for providing logical representations of the logical product terms generated by the first logic array to the common input lines to generate a sum of product terms on the output lines during the second time interval.

2. The programmable logic array circuit of claim 1 wherein the first logic means includes a plurality of logical circuits coupled to selected ones of the output lines for performing a predetermined logic function on at least some of the first output signals during the first time interval and for performing the predetermined logic function on at least some of the second output signals provided on the same output lines during the second time interval.

3. The programmable logic array circuit of claim 2 wherein the predetermined logic function is that of the Exclusive-OR function.

4. The programmable logic array circuit of claim 2 wherein the first logic means comprises a plurality of Exclusive-NOR circuits.

5. The programmable logic array circuit of claim 1 wherein the first logic means includes first logical NOR circuitry for providing a first logical NOR function of at least one of the product term-containing signals for application to the input lines of the second logic array during the second time interval.

6. The programmable logic array circuit of claim 5 wherein the first logic means further includes second logical NOR circuitry for providing a second logical NOR function of the same product term-containing signals as the first logical NOR circuitry and at least one of a different one of the product term-containing signals.

7. The programmable logic array circuit of claim 1 wherein the first and second logic arrays comprise a plurality of NOR circuits.

8. A programmable logic array circuit for implementing the binary addition of a pair of n-bit binary numbers including a plurality of input decoders responsive to corresponding bits of said binary numbers for generating simple binary addition logical functions, a logical AND array responsive to said functions for generating a plurality of product terms and a logical OR array responsive to a plurality of input signals for generating a plurality of sum terms, the improvement comprising:

a plurality of Exclusive-NOR circuit means for generating logical Exclusive-NOR functions in response to pairs of input signals;

a plurality of NOR circuit means for generating logical NOR functions in response to input signals;

first means for coupling selected pairs of product terms to the inputs of at least one Exclusive-NOR circuit means;

second means for coupling the inputs of at least said one of said Exclusive-NOR circuit means to at least one of said NOR circuit means;

third means for coupling selected paris of sum terms to at least one of said Exclusive-NOR circuit means; and fourth means for coupling the output of at least one of said Exclusive-NOR means to an output circuit, said output being representative of at least one of the output bits of the sum of the n-bit binary number to be added.

9. The programmable logic array circuit of claim 8 wherein the selected pairs of product terms and sum terms are applied to at least one (some) of the same Exclusive-NOR circuits during two different time intervals, the output of which is provided to the NOR circuits during a first time interval and to output circuits during a second time interval.

10. The programmable logic array circuit of claim 9 wherein the AND and the OR array are implemented as logical NOR circuits.

* * * * *